United States Patent
Jang et al.

(10) Patent No.: US 7,855,117 B2
(45) Date of Patent: Dec. 21, 2010

(54) METHOD OF FORMING A THIN LAYER AND METHOD OF MANUFACTURING A SEMICONDUCTOR DEVICE

(75) Inventors: Won-Jun Jang, Seoul (KR); Ho-Min Son, Suwon-si (KR); Woong Lee, Seoul (KR); Yong-Woo Hyung, Yongin-si (KR); Jung-Geun Jee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1086 days.

(21) Appl. No.: 11/589,866

(22) Filed: Oct. 31, 2006

(65) Prior Publication Data

US 2008/0064171 A1 Mar. 13, 2008

(30) Foreign Application Priority Data

Sep. 7, 2006 (KR) ...................... 10-2006-0085941

(51) Int. Cl.
*H01L 21/76* (2006.01)
(52) U.S. Cl. ....................... 438/297; 438/296; 438/425; 438/426
(58) Field of Classification Search ......... 438/296–297, 438/425–426, 785–786, 778, 787
See application file for complete search history.

(56) References Cited

U.S. PATENT DOCUMENTS

| 5,858,842 A | * | 1/1999 | Park | ........................... 438/297 |
| 2003/0008526 A1 | * | 1/2003 | Gambino et al. | ............ 438/787 |

FOREIGN PATENT DOCUMENTS

| JP | 05-198821 | 8/1993 |
| KR | 1020050039339 A | 4/2005 |
| KR | 1020050113793 A | 12/2005 |

\* cited by examiner

*Primary Examiner*—Dung A. Le
(74) *Attorney, Agent, or Firm*—Harness, Dickey & Pierce, P.L.C.

(57) ABSTRACT

In a method of forming a thin layer (e.g., a charge trapping nitride layer) of a semiconductor device (e.g. a charge trapping type non-volatile memory device), the nitride layer may be formed on a first area of a substrate. A blocking layer may be formed on the nitride layer. An oxide layer may be formed on a second area of the substrate while preventing or reducing an oxidation of the nitride layer by a radical oxidation process in which oxygen radicals react with the second area of the substrate and the blocking layer in the first area of the substrate. The nitride layer may ensure sufficient charge trapping sites and may have a uniform thickness without oxidation thereof in the radical oxidation process.

18 Claims, 6 Drawing Sheets

US 7,855,117 B2

METHOD OF FORMING A THIN LAYER AND METHOD OF MANUFACTURING A SEMICONDUCTOR DEVICE

PRIORITY STATEMENT

This application claims priority under 35 USC §119 to Korean Patent Application No. 2006-85941 filed on Sep. 7, 2006, in the Korean Intellectual Property Office (KIPO), the entire contents of which are incorporated herein by reference.

BACKGROUND

1. Field

Example embodiments relate to a method for forming a thin layer and a method of manufacturing a semiconductor device. Other example embodiments relate to a method of forming a thin layer including silicon nitride to ensure sufficient charge trapping sites and improved interface characteristics, and a method of manufacturing a charge trapping type non-volatile memory device using the method of forming the thin layer.

2. Description of the Related Art

Generally, non-volatile semiconductor memory devices are divided into floating gate type non-volatile memory devices and charge trapping type non-volatile memory devices in accordance with structures of unit memory cells thereof. The charge trapping type memory device may have a silicon oxide nitride oxide semiconductor (SONOS) structure, and thus the charge trapping type memory device may be referred to as an SONOS type non-volatile memory device.

In the floating gate type memory device, a unit memory cell may include a tunnel oxide layer formed on a semiconductor substrate, a floating gate, a dielectric layer and a control gate. Data may be stored into the floating gate as free charges are injected into the floating gate. As for the floating gate type memory device, the injected charges in the floating gate may be dissipated when some defects may occur in the tunnel oxide layer between the substrate and the floating gate. The tunnel oxide layer of the floating gate type memory device may have a sufficiently thick thickness. A relatively high driving voltage may be required when the floating gate type memory device includes the relatively thick tunnel oxide layer so that the peripheral circuit of the floating gate type memory device may be considerably complicated. The floating gate type memory device may not be relatively highly integrated.

In the SONOS type non-volatile memory device, the unit memory cell may include a tunnel oxide layer formed on the semiconductor substrate, a charge trapping layer having a multi-layered structure of a silicon nitride layer and a dielectric layer, and a single electrode formed on the charge trapping layer. Data may be stored into the SONOS type non-volatile memory device as charges are injected into charge trapping sites of the silicon nitride layer. The charges may be trapped in relatively deep level trapping sites of the silicon nitride layer such that the tunnel oxide layer may have a relatively thin thickness.

Because the silicon nitride layer may serve as a charge trapping layer in the SONOS type non-volatile memory device, electrical characteristics of the SONOS type non-volatile memory device may directly depend on properties of the silicon nitride layer. As for the SONOS type non-volatile memory device, a surface of the silicon nitride layer may be inevitably oxidized in successive thermal processes for manufacturing the SONOS type non-volatile memory device.

When the silicon nitride layer is partially oxidized, silicon oxide may be generated between the silicon nitride layer and the dielectric layer. The dielectric layer may be relatively thick whereas a dielectric constant of the dielectric layer may decrease. The silicon nitride layer may have a reduced thickness because of a partial oxidation of the silicon nitride layer, and thus a bond strength between silicon and nitride in the silicon nitride layer may increase. The charge trapping sites in the silicon nitride layer may be considerably reduced, to thereby deteriorate a programming operation and an erasing operation of the SONOS type non-volatile memory device.

To settle the above-mentioned problems, a method for manufacturing a charge trapping type non-volatile memory device may be needed in which a silicon nitride layer serving as a charge trapping layer of the charge trapping type non-volatile memory device is not deteriorated in successive thermal processes while ensuring sufficient charge trapping sites of the silicon nitride layer.

SUMMARY

Example embodiments provide a method of forming thin layers (e.g., a silicon oxide layer and/or a silicon nitride layer) on different areas of a substrate. Example embodiments provide a method of manufacturing a semiconductor device such as a charge trapping type non-volatile memory device using the method of forming thin layers.

According to example embodiments, there is provided a method of forming a thin layer. In the method of forming the thin layer, a nitride layer may be formed on a first area of a substrate, and an oxide layer may be formed on a second area of the substrate in order to prevent or reduce oxidation of the nitride layer by a radical oxidation process in which oxygen radicals react with the second area of the substrate and a blocking layer in the first area of the substrate. The method may further include the blocking layer may be formed on the nitride layer. In example embodiments, the nitride layer may include silicon nitride and the oxide layer may include silicon oxide. In example embodiments, the radical oxidation process may be performed at a temperature of about 900° C. to about 1,200° C. In example embodiments, the radical oxidation process may be carried out using a source gas including hydrogen and oxygen under a pressure of about 0.001 Torr to about 1.0 Torr. In example embodiments, a partial pressure of hydrogen in the source gas may be about 10% to about 50% of a partial pressure of oxygen in the source gas. In example embodiments, the oxygen radicals may be generated from oxygen using a plasma.

According to example embodiments, there is provided a method of manufacturing a semiconductor device such as a charge trapping type non-volatile memory device. In the method of manufacturing the charge trapping type non-volatile memory device, a structure may be formed on a substrate having a first area and a second area. The structure may include a tunnel oxide layer pattern, a charge trapping nitride layer pattern and a first blocking layer pattern. A trench may be formed on a portion of the substrate adjacent to the structure, and an isolation layer may be formed in the trench. The tunnel oxide layer pattern, the charge trapping nitride layer pattern and the first blocking layer pattern may be partially removed to expose the second area of the substrate.

A thin layer may be formed according to example embodiments, wherein the nitride layer is the charge trapping nitride layer pattern and the blocking layer is the first blocking layer pattern. After the remaining first blocking layer pattern is removed, a dielectric layer may be formed on the charge trapping nitride layer. An electrode may be formed on the dielectric layer.

In example embodiments, the charge trapping nitride layer pattern may include silicon nitride and the oxide layer may include silicon oxide. In example embodiments, the first blocking layer pattern may include silicon oxide formed by a chemical vapor deposition process. In example embodiments, the isolation layer may be formed by forming an insulation layer on the blocking layer pattern to fill the trench, and by partially removing the insulation layer and the first blocking layer pattern. In example embodiments, the remaining first blocking layer pattern may have a thickness of about 50 Å to about 100 Å.

In example embodiments, the isolation layer may include a first insulation film, and a second insulation film having a crystalline structure substantially denser than that of the first insulation film. In example embodiments, a second blocking layer pattern may be formed on a sidewall of the structure, and then a portion of the substrate adjacent to the structure may be thermally oxidized. The portion of the substrate may be thermally oxidized by a radical oxidation process at a temperature of about 900° C. to about 1,200° C.

In example embodiments, a third blocking layer pattern may be formed on a sidewall of the trench and the structure before forming the isolation layer. A sidewall oxide layer may be formed on the sidewall of the trench by thermally oxidizing the sidewall of the trench. For example, the sidewall oxide layer may be formed at a temperature of about 900° C. to about 1,200° C. In example embodiments, the oxide layer may have a thickness of about 30 Å to about 100 Å.

According to example embodiments, an oxide layer may be formed in one area of a substrate without oxidizing a nitride layer positioned in another area of the substrate while ensuring sufficient charge trapping sites of the nitride layer. A nitride layer pattern serving as a charge trapping layer of a charge trapping type non-volatile memory device may be formed without the need to form an oxide layer between the nitride layer and a dielectric layer. The charge trapping type non-volatile memory device may have improved electrical characteristics due to the nitride layer pattern having sufficient charge trapping sites without an oxidation thereof.

BRIEF DESCRIPTION OF THE DRAWINGS

Example embodiments will be more clearly understood from the following detailed description taken in conjunction with the accompanying drawings.

FIGS. 1 to 3 are diagrams illustrating a method of forming a thin layer in accordance with example embodiments; and FIGS. 4 to 12 are diagrams illustrating a method of manufacturing a charge trapping type non-volatile memory device in accordance with example embodiments.

DESCRIPTION OF EXAMPLE EMBODIMENTS

Figure 1:
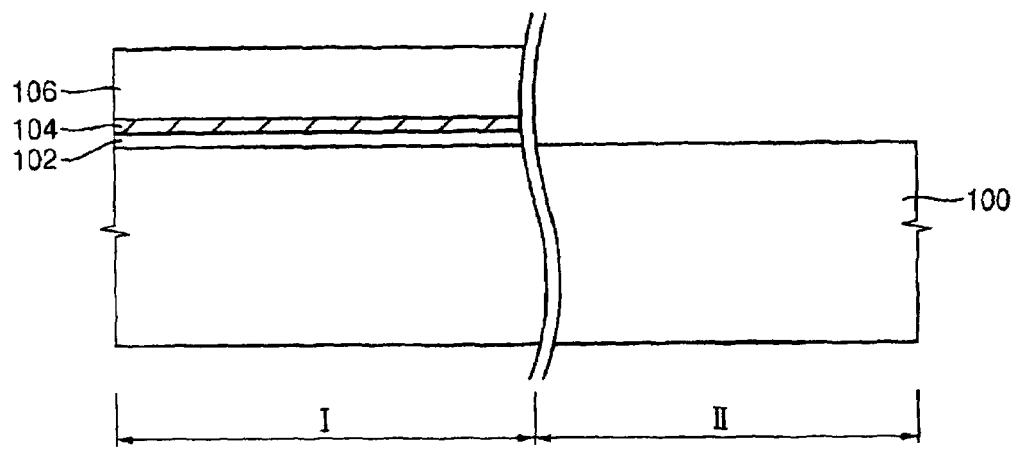
FIGS. 1-12 represent non-limiting, example embodiments as described herein.

Example embodiments are described more fully hereinafter with reference to the accompanying drawings, in which example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Thin Layer

Figure 2:
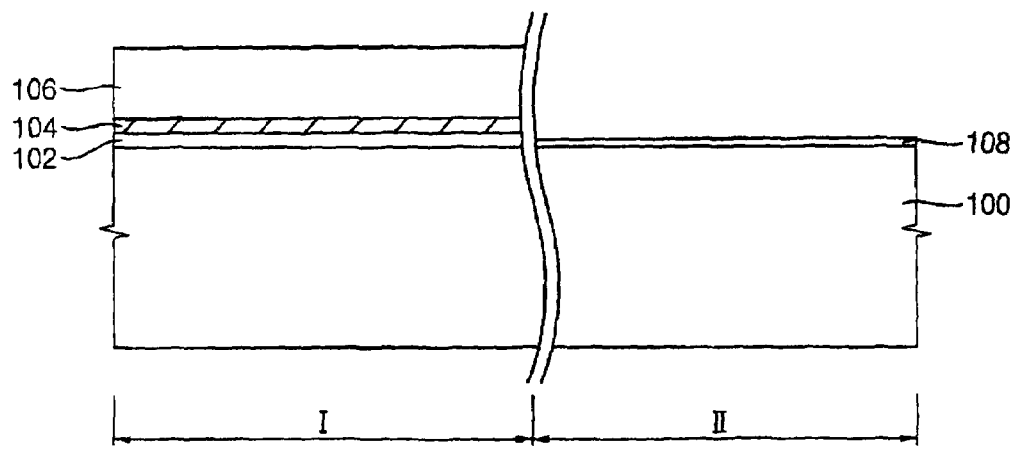
Figure 3:
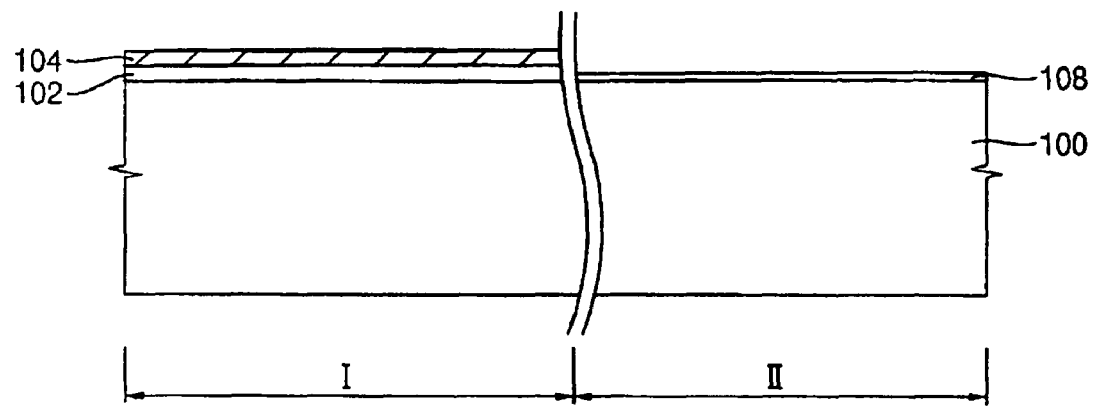

FIGS. 1 to 3 are diagrams illustrating a method of forming a thin layer in accordance with example embodiments. Referring to FIG. 1, a first area I and a second area II may be defined on a substrate 100. The substrate 100 may include single crystalline silicon. In example embodiments, a first oxide layer (not shown), a nitride layer (not shown) and a blocking layer (not shown) may be sequentially formed on the substrate 100. The first oxide layer may be formed using silicon oxide, and the nitride layer may be formed using silicon nitride. The blocking layer may be formed using silicon oxide. The first oxide layer may be formed by a thermal oxidation process. A portion of the substrate 100 may be thermally oxidized, to thereby form the first oxide layer. The nitride layer and the blocking layer may be formed by chemical vapor deposition (CVD) processes, respectively.

The blocking layer may prevent or reduce oxidation of the nitride layer in successive processes. When the blocking layer has a thickness below about 50 Å, the blocking layer may not properly prevent or reduce the oxidation of the nitride layer. The blocking layer may not be effectively removed later without damaging structures adjacent to the blocking layer when the blocking layer has a thickness above about 100 Å. The blocking layer may have a thickness in a range of about 50 Å to about 100 Å. In example embodiments, the blocking layer may include middle temperature oxide (MTO) formed at a temperature of about 700° C. to about 750° C.

A photoresist pattern (not shown) may be formed on the blocking layer. The photoresist pattern may cover a first portion of the blocking layer positioned in the first area I of the substrate 100. A second portion of the blocking layer in the second area II may be exposed after a formation of the photoresist pattern.

Using the photoresist pattern as an etching mask, the blocking layer, the nitride layer and the first oxide layer may be etched. The nitride layer and the first oxide layer may be etched by a wet etching process to reduce an etching damage to the second area II of the substrate 100. The photoresist may be removed by an ashing process and/or a stripping process. After the etching process, a structure including a first oxide layer pattern 102, a nitride layer pattern 104 and a blocking layer pattern 106 may be formed in the first area of the substrate 100. The second area II of the substrate 100 may be exposed.

Referring to FIG. 2, a second oxide layer 108 may be formed in the second area II by a radical oxidation process using oxygen radicals. The second oxide layer 108 may include silicon oxide. The second oxide layer 108 may have a thickness substantially thinner than that of the first oxide layer pattern 102. For example, the second oxide layer 108 may have a thickness of about 30 Å to about 100 Å.

In the radical oxidation process for forming the second oxide layer 108, the oxygen radicals may not reach the nitride layer pattern 104 because the blocking layer pattern 106 may cover the nitride layer pattern 104. The lifetime of the oxygen radicals may be relatively short so that the oxygen radicals may react more rapidly with the blocking layer pattern 106. When the oxygen radicals are reacted with ingredients in the blocking layer pattern 106, the oxygen radicals may be stabilized such that the oxygen radicals may not permeate into the nitride layer pattern 104. The lifetime of the oxygen radicals may indicate a time required to stabilize the oxygen radicals. To prevent or reduce the permeation of the oxygen radicals into the nitride layer pattern 104, the oxygen radicals may have a relatively high reactivity. The reactivity of the oxygen radicals may increase as follows.

In example embodiments, the radical oxidation process may be carried out at a temperature higher than that of the conventional oxidation process so as to ensure the higher reactivity of the oxygen radicals. When the radical oxidation process is performed at a temperature below about 900° C., the oxygen radicals may not have proper reactivity. When the radical oxidation process is executed at a temperature above about 1,200° C., the substrate 100 may have a relatively serious thermal budget, and elements of a reaction chamber having the substrate 100 may be damaged although the reactivity of the oxygen radical may increase. The radical oxidation process may be performed at a temperature in a range of about 900° C. to about 1,200° C. For example, the radical oxidation process may be carried out at a temperature of about 950° C to about 1,000° C.

In example embodiments, the radical oxidation process may be performed using a source gas including hydrogen and oxygen at a lower pressure of about 0.001 Torr to about 1.0 Torr. When the source gas is introduced into the reaction chamber conditioned to have the higher temperature and the lower pressure, the oxygen radicals may be generated from the source gas and the oxygen radicals may be reacted with silicon in the substrate 100, thereby forming the second oxide layer 108 on the substrate 100. In order to improve the reactivity of the oxygen radicals, a partial pressure of hydrogen may be increased compared to the conventional radical oxidation process. For example, the partial pressure of hydrogen may be about 10% to about 50% of that of oxygen.

In example embodiments, the radical oxidation process may be carried out using a batch type oxidation apparatus and/or a single type oxidation apparatus. When the radical oxidation process is performed using the single type oxidation apparatus, the second oxide layer 108 may be grown more rapidly than when the second oxide layer 108 is formed using the batch type oxidation apparatus. The oxygen radicals may not permeate into an underlying layer and/or an underlying structure because a permeability of the oxygen radicals may be lowered. The second oxide layer 108 may be desirably formed by the radical oxidation process executed using the single type oxidation apparatus. In example embodiments, the oxygen radicals may be generated using a plasma so as to form the second oxide layer 108 on the second area II of the substrate 100. The oxygen radicals may be generated over the substrate 100 after the plasma is formed over the substrate 100. The substrate 100 may be damaged by the plasma while forming the second oxide layer 108.

Referring to FIG. 3, a mask pattern (not shown) may be formed on the second area II of the substrate 100, and then the blocking layer pattern 106 in the first area I may be removed using the mask pattern. The mask pattern may be formed using a material having an etching selectivity relative to the blocking layer pattern 106. For example, the mask pattern may be formed using silicon nitride and/or silicon oxynitride. The blocking layer pattern 106 may be etched by a wet etching process. After etching the blocking layer pattern 106, the mask pattern may be removed from the second area II of the substrate 100. A second oxide layer 108 may remain on the second area II, whereas the nitride layer pattern 104 is located on the first area I.

According to example embodiments, the nitride layer pattern 104 in the first area I of the substrate 100 may not be oxidized while forming the second oxide layer 108 in the second area II of the substrate 100. A thickness of the nitride layer pattern 104 may be effectively maintained and charge trapping sites in the nitride layer pattern 104 may not be reduced. The nitride layer pattern 104 may be desirably employed as a charge trapping layer on a charge trapping type non-volatile memory device so as to improve electrical characteristics of the charge trapping type non-volatile memory device.

Method of Manufacturing a Charge Trapping Type Non-volatile Memory Device

Figure 4:
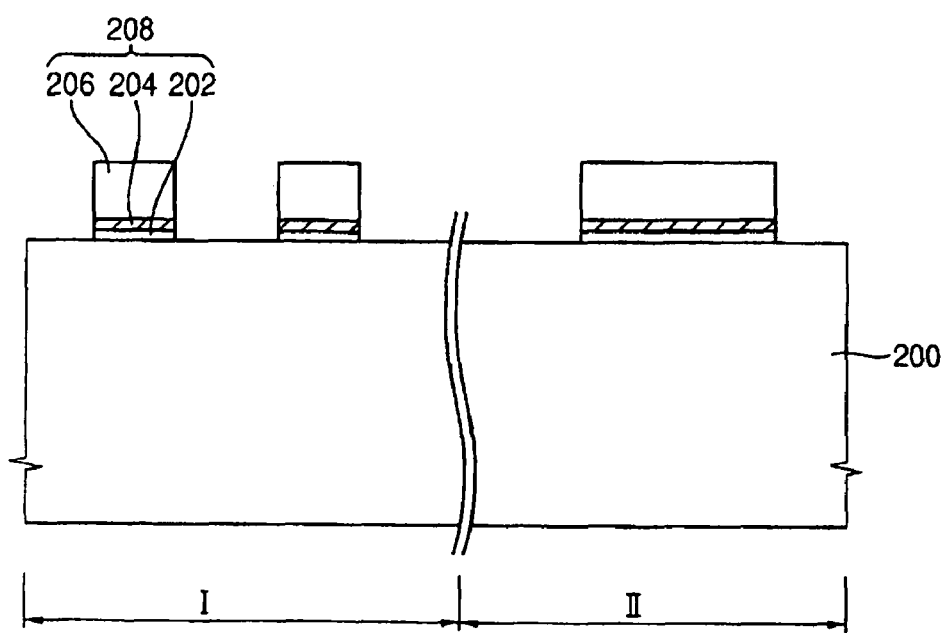

FIGS. 4 to 12 are diagrams illustrating a method of manufacturing a semiconductor device such as a charge trapping type non-volatile memory device in accordance with example embodiments. Referring to FIG. 4, a substrate 200 may be divided into a first area I and a second area II. The substrate 200 may include silicon, for example, single crystalline silicon. The first area I may correspond to a cell area of the charge trapping type non-volatile memory device, whereas the second area II may correspond to a peripheral circuit area of the charge trapping type non-volatile memory device. Unit memory cells may be formed in the cell area, and electrical elements (e.g., metal oxide semiconductor (MOS) transistors) may be formed in the peripheral circuit area. A tunnel oxide layer (not shown) and a nitride layer (not shown) may be formed on the substrate 200. The nitride layer may be formed using silicon nitride.

A first blocking layer (not shown) may be formed on the nitride layer. The first blocking layer may be formed using oxide. The first blocking layer may prevent or reduce oxidation of the nitride layer and damage to the nitride layer in a successive oxidation process and a successive polishing process. The first blocking layer may be removed in a successive etching process without causing etching damage to the nitride layer. The first blocking layer may be formed using middle temperature oxide (MTO). After performing the successive polishing process, the first blocking layer may have a predetermined or given thickness of about 50 Å to about 100 Å. The first blocking layer may have an initial thickness of about 100 Å to about 1,000 Å. In example embodiments, a second nitride layer (not shown) may be formed on the first blocking layer. The second nitride layer may be formed using silicon nitride. The second nitride layer may serve as a polishing stop layer in the successive polishing process.

A first mask pattern (not shown) may be formed on the first blocking layer, and then the first blocking layer, the nitride layer and the tunnel oxide layer may be partially etched using the mask pattern as an etching mask. A structure 208 including a tunnel oxide layer pattern 202, a nitride layer pattern 204 and a first blocking layer pattern 206 may be formed on the first area I of the substrate 200. In example embodiments, a plurality of structures 208 may be formed in the first area I of the substrate 200 having a predetermined or given distance from one another. Each of the structures 208 may have a line shape extending along a first direction.

In example embodiments, the structures 208 may serve as mask patterns for forming a trench 214 (see FIG. 6) that defines an isolation region and an active region of the substrate 200. A first portion of the substrate 200 exposed between the structures 208 may correspond to the isolation region, whereas a second portion of the substrate 200 beneath the structure 208 may correspond to the active region.

Figure 5:
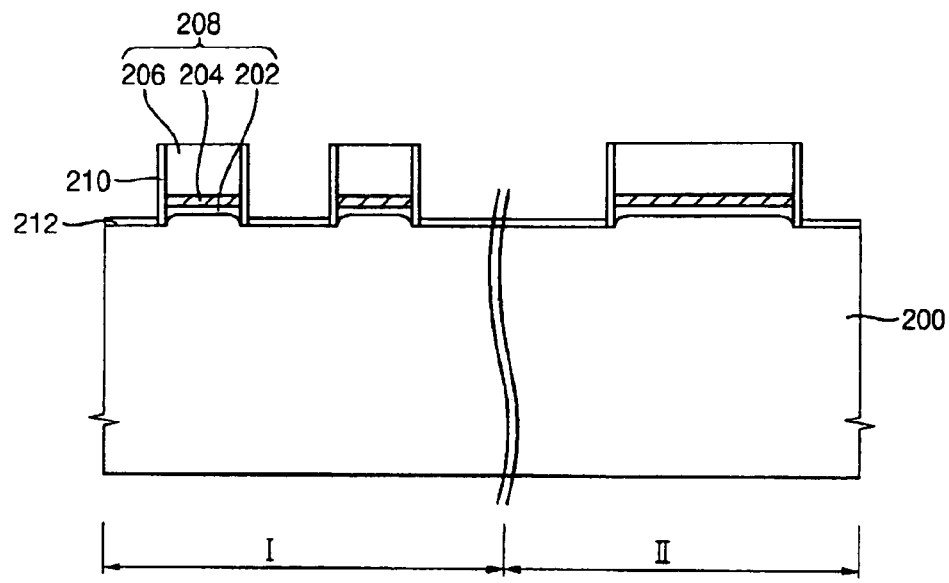

Referring to FIG. 5, a second blocking layer (not shown) may be formed on the substrate 200 to cover the structures 208. The second blocking layer may be formed using oxide, for example, MTO. The second blocking layer may prevent or reduce oxidation of a sidewall of the nitride layer pattern 204 in the first area I. The second blocking layer may be partially etched to form a second blocking layer pattern 210 on a sidewall of the structure 208. The second blocking layer pattern 210 may be formed by an anisotropic etching process. The second blocking layer pattern 210 may have a spacer shape. In example embodiments, the process for forming the second blocking layer pattern 210 may be omitted so as to simplify the processes of manufacturing the charge trapping type non-volatile memory device.

A dummy oxide layer 212 may be formed on the first portion of the substrate 200 between the structures 208 corresponding to the active region. The dummy oxide layer 212 may be formed by oxidizing the first portion of the substrate 200. When the dummy oxide layer 212 is formed on the active region of the substrate 200, an edge portion of the active region may be concave and/or convex. In the oxidation process for forming the dummy oxide layer 212, an oxidizing agent (e.g., oxygen) may be permeated into a surface of the substrate 200 and an edge portion of the tunnel oxide layer pattern 202, so that the edge portion of the active region may be oxidized more than other portions of the active region. The edge portion of the active region may be concave and/or convex.

After performing the oxidation process for forming the dummy oxide layer 212, a central portion of the tunnel oxide layer pattern 202 may be uniformly formed on a central portion of the active region, whereas the edge portion of the active region may be non-uniform. The oxidation process for forming the dummy oxide layer 212 may be pertinently controlled to prevent or reduce the oxidizing agent from undesirably diffusing into a portion of the substrate 200 beneath the central portion of the tunnel oxide layer pattern 202. The oxidation process for forming the dummy oxide layer 212 may be adequately adjusted to prevent or reduce an oxide layer from being formed on the sidewall of the nitride layer pattern 204.

In example embodiments, the oxidation process for forming the dummy oxide layer 212 may include a radical oxidation process using oxygen radicals having a relatively high reactivity. In the radical oxidation process for forming the dummy oxide layer 212, the oxygen radicals may react with ingredients in the portion of the substrate 200, whereas the oxygen radicals may not reach the nitride layer pattern 204. The lifetime of the oxygen radicals may be relatively short so that the oxygen radicals may completely react with the ingredients in the portion of the substrate 200. A sidewall of the nitride layer pattern 204 may not react with the oxygen radicals and also the thickness of the tunnel oxide layer 202 may be uniformly maintained.

In example embodiments, the radical oxidation process for forming the dummy oxide layer 212 may be substantially the same as that described with reference to FIG. 2. The radical oxidation process for forming the dummy oxide layer 212 may be carried out using a source gas including hydrogen and oxygen at a relatively low pressure of about 0.001 Torr to about 1.0 Torr. A partial pressure of hydrogen in the source gas may be about 10% to about 50% of that of oxygen in the source gas. The radical oxidation process for forming the dummy oxide layer 212 may be performed at a relatively high temperature of about 900° C. to about 1,200° C. The radical oxidation process for forming the dummy oxide layer 212 may be executed using a single type oxidation apparatus and/or a batch type oxidation apparatus. As described above, the dummy oxide layer 212 may be desirably formed using the single type oxidation apparatus.

Figure 6:
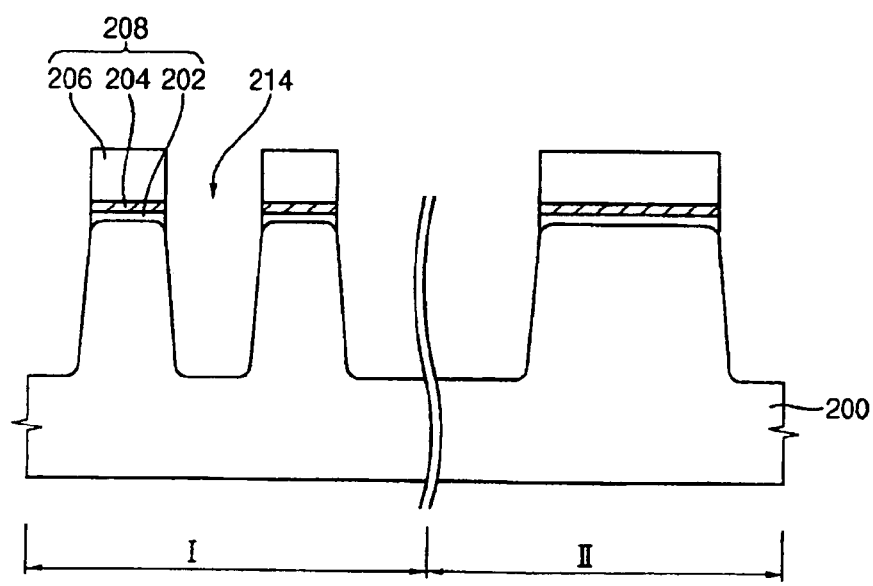

Referring to FIG. 6, the dummy oxide layer 212 and the portion of the substrate 200 between the structures 208 may be etched to form a trench 214. The trench 214 may be formed by an anisotropic etching process.

Figure 7:
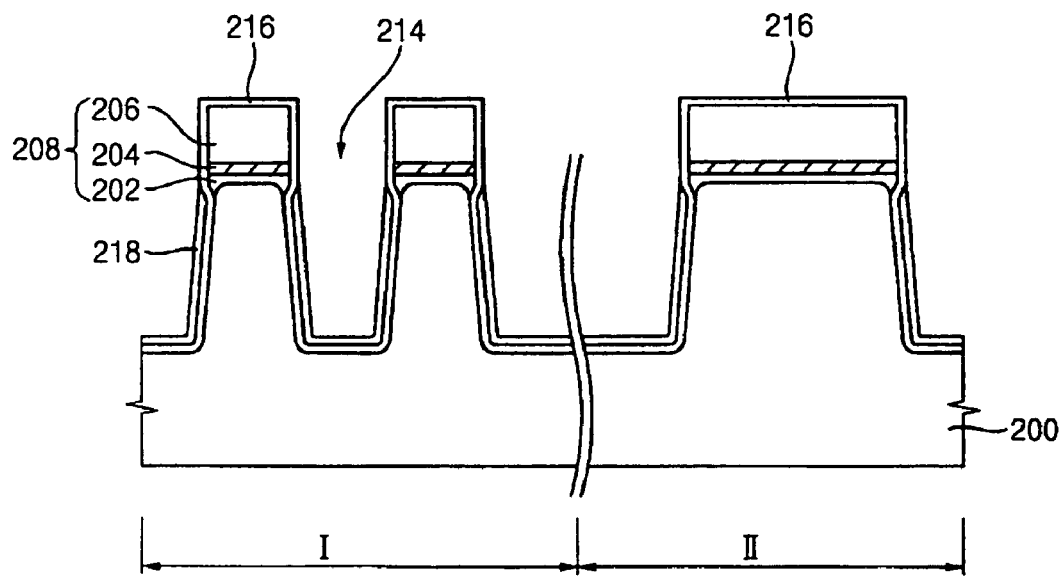

Referring to FIG. 7, a third blocking layer 216 may be formed on a sidewall of the trench 214 and the structures 208. The third blocking layer 216 may be formed using an oxide (e.g., MTO). A sidewall oxide layer 218 may be formed on the sidewall of the trench 214, the sidewall of the structure 208 and an upper face of the structure 208. The sidewall oxide layer 218 may be formed by an oxidation process. The sidewall oxide layer 218 may cure damages to the sidewalls of the trench 208 and the structure 208 generated in the etching process for forming the trench 214.

In the oxidation process for the sidewall oxide layer 218, a sidewall of the nitride layer pattern 204 may be undesirably oxidized, so that the nitride layer pattern 204 may have a reduced width in accordance with a partial oxidation of the sidewall of the nitride layer pattern 204. The sidewall oxide layer 218 curing the damage to the sidewall of the trench 214 may be formed without the partial oxidation of the nitride layer pattern 204.

In example embodiments, the sidewall oxide layer 218 may be formed by a radical oxidation process in order to prevent or reduce the partial oxidation of the nitride layer pattern 204. In the radical oxidation process for forming the sidewall oxide layer 218, oxygen radicals having a relatively high reactivity may react with ingredients in the sidewall of the trench 214 and the third blocking layer 216 before the oxygen radicals reach the nitride layer pattern 204 beneath the third blocking layer 216. The lifetime of the oxygen radicals may be sufficiently short such that the oxygen radicals may react with the ingredients in the sidewall of the trench 214 and the third blocking layer 216 without oxidizing the sidewall of the nitride layer pattern 204. The sidewall of the nitride layer pattern 204 may not be consumed so that the initial width of the nitride layer pattern 204 may be effectively maintained. In example embodiments, the sidewall oxide layer 218 may be formed by a process substantially the same as the radical oxidation process described with reference to FIG. 2.

Figure 8:
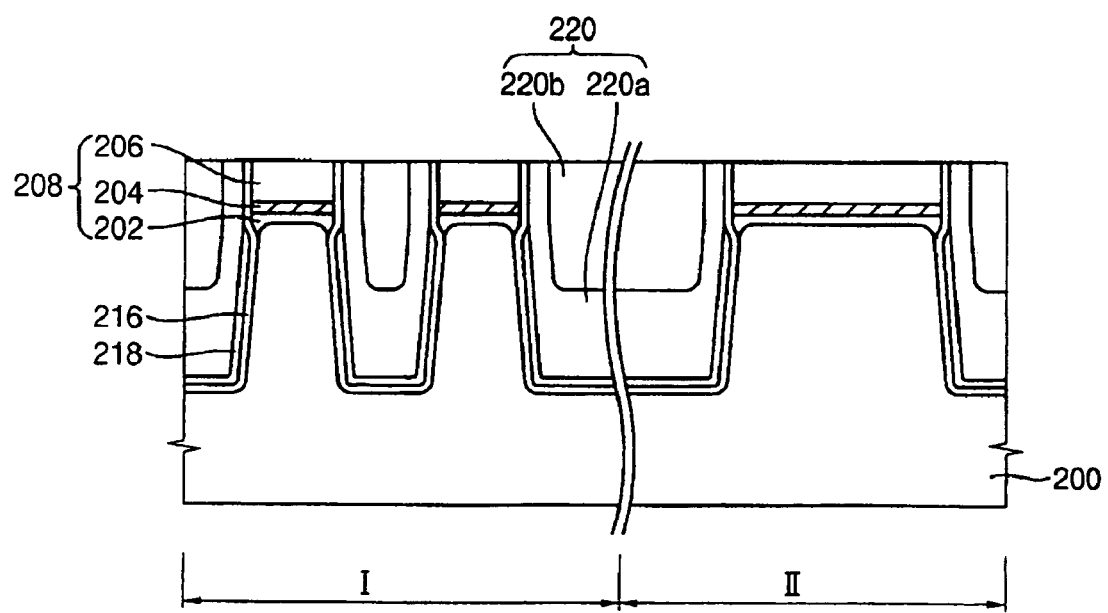

Referring to FIG. 8, an insulation layer (not shown) may be formed on the sidewall oxide layer 218 and the first area I of the substrate 200 to fill up the trench 214. In some example embodiments, the insulation layer may include a first insulation film and a second insulation film. The first insulation film may partially fill up the trench 214, and the second insulation film may fully fill up the trench 214. The first insulation film may be formed using a first insulation material, which fills up the trench 214 (e.g., BPSG, PSG, USG, SOG and/or FOX). The second insulation film may be formed using a second insulation material that has a crystalline structure denser than that of the first insulation material. For example, the second insulation material may include HDP-CVD oxide.

The insulation layer may be partially polished until the structure 208 is exposed so that an isolation layer 220 may be formed in the trench 214. The isolation layer 220 may include a first insulation film pattern 220a and a second insulation film pattern 220b The first insulation film pattern 220a may partially fill up the trench 214 and the second insulation film pattern 220b may fully fill up the trench 214. The polishing process for forming the isolation layer 220 may be carried out until the first blocking layer pattern 206 is exposed. When the polishing stop layer is provided on the first blocking layer pattern 206, the polishing process for forming the isolation layer 220 may be performed until the polishing stop layer is exposed. The polishing stop layer may be removed from the first blocking layer pattern 206 by a wet etching process.

Figure 9:
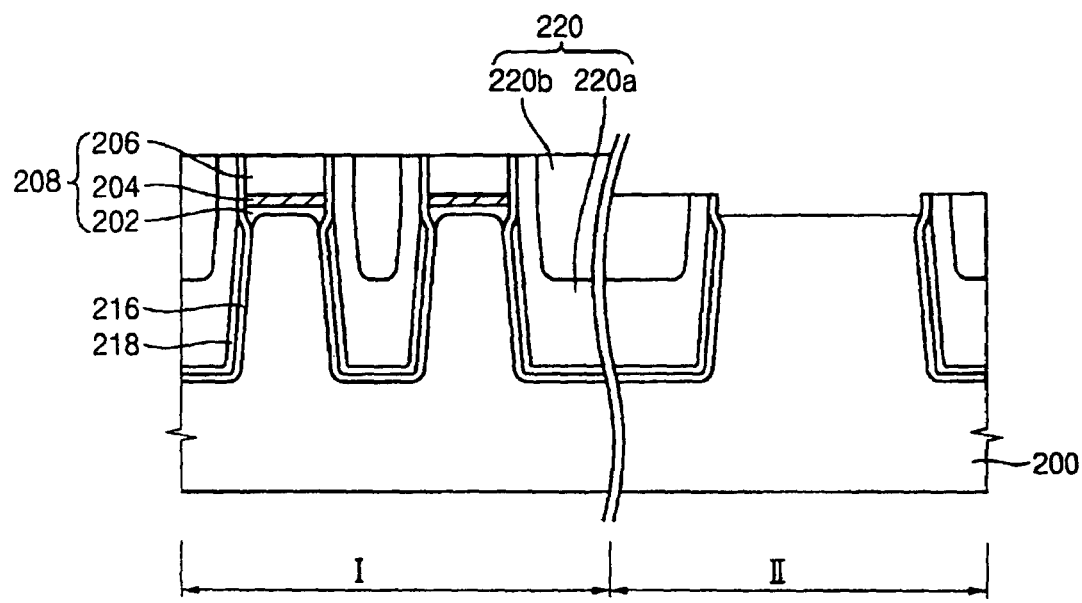

Referring to FIG. 9, a second mask pattern (not shown) may be formed on the first area I of the substrate 200. Using the second mask pattern as an etching mask, the first blocking layer pattern 206 may be removed from the first area I of the substrate 200. The first blocking layer pattern 206 may be removed by a wet etching process and/or a dry etching process. In the etching process for removing the first blocking layer pattern 206, a portion of the isolation layer 220 adjacent to the first blocking layer pattern 206 may be simultaneously removed.

A nitride layer pattern and a tunnel oxide layer pattern in the second area II may be removed from the second area II of the substrate 200. When the nitride layer pattern and the tunnel oxide layer pattern in the second area II are removed by a dry etching process using a plasma, the substrate 200 may be damaged by the plasma. The nitride layer pattern and the tunnel oxide layer pattern in the second area II may be removed by a wet etching process. After removal of the nitride layer pattern and the tunnel oxide layer pattern, the second area II of the substrate 200 may be exposed. After removing the second mask pattern from the first area I of the substrate 200, the first blocking layer pattern 206 remaining in the first area I may have a relatively thin thickness of about 50 Å to about 100 Å.

Figure 10:
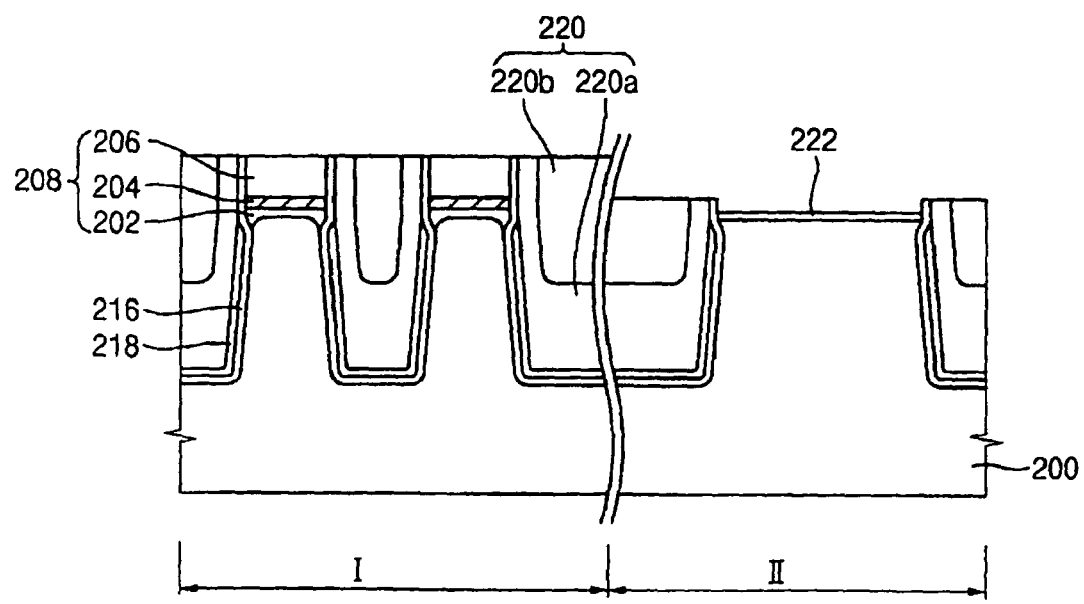

Referring to FIG. 10, an oxide layer 222 may be formed on the second area II of the substrate 200. The oxide layer 222 may be formed by a radical oxidation process. In the radical oxidation process for forming the oxide layer 222, oxygen radicals having a relatively high reactivity may completely react with ingredients in the second area II and the first blocking layer pattern 206 without oxidizing the nitride layer pattern 204 in the first area I. The nitride layer pattern 204 may not be oxidized in the radical oxidation process for forming the oxide layer 222. In example embodiments, the oxide layer 222 may be formed in the second area II by the radical process substantially the same as that described with reference to FIG. 2.

A relatively low voltage MOS transistor may be formed in the second area II of the substrate 200. The relatively low voltage MOS transistor may have a driving voltage of about 3V to about 5V. The oxide layer 222 may serve as a gate insulation layer of the relatively low voltage MOS transistor. When the oxide layer 222 has a thickness below about 30 Å, the relatively low voltage MOS transistor may have an increased leakage current. When the oxide layer 222 has a thickness above about 100 Å, the relatively low voltage MOS transistor may not have a required lower driving voltage. The oxide layer 222 may have a thickness of about 30 Å to about 100 Å.

In a formation of the oxide layer 222 on the second area II of the substrate 200, the nitride layer pattern 204 in the first area I may not be oxidized. An undesired oxide layer may not be formed between the nitride layer pattern 204 and the first blocking layer pattern 206. The initial thickness of the nitride layer pattern 204 may be uniformly maintained. The charge trapping sites in the nitride layer pattern 204 may be sufficiently ensured without oxidizing the nitride layer pattern 204.

Figure 11:
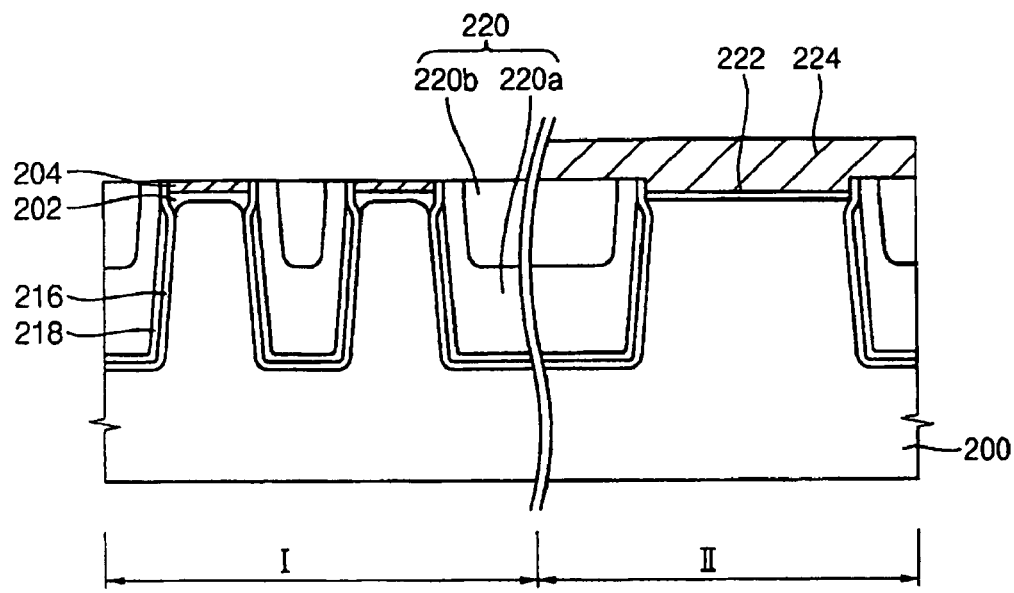

Referring to FIG. 11, a polysilicon layer (not shown) may be formed on the oxide layer 222, the isolation layer 220 and the first blocking layer pattern 206. The polysilicon layer may be patterned to form a gate electrode of a relatively low voltage MOS transistor in the second area II of the substrate 200. The polysilicon layer on the first area I may be removed to form a polysilicon layer pattern 224 on the second area II. The polysilicon layer pattern 224 may be formed by partially etching the polysilicon layer using a photoresist pattern as an etching mask after the photoresist pattern is formed on the polysilicon layer.

The first blocking layer pattern 206 may be removed from the first area I of the substrate 200. In some example embodiments, the first blocking layer pattern 206 may be removed by a wet etching process so as to prevent or reduce damage to the nitride layer pattern 204 beneath the first blocking layer pattern 206. In the etching process for removing the first blocking layer pattern 206, the first blocking layer pattern 206 may be more easily removed without damage to the nitride layer pattern 204 because the first blocking layer pattern 206 may have a thickness of about 50 to about 100 Å.

Figure 12:
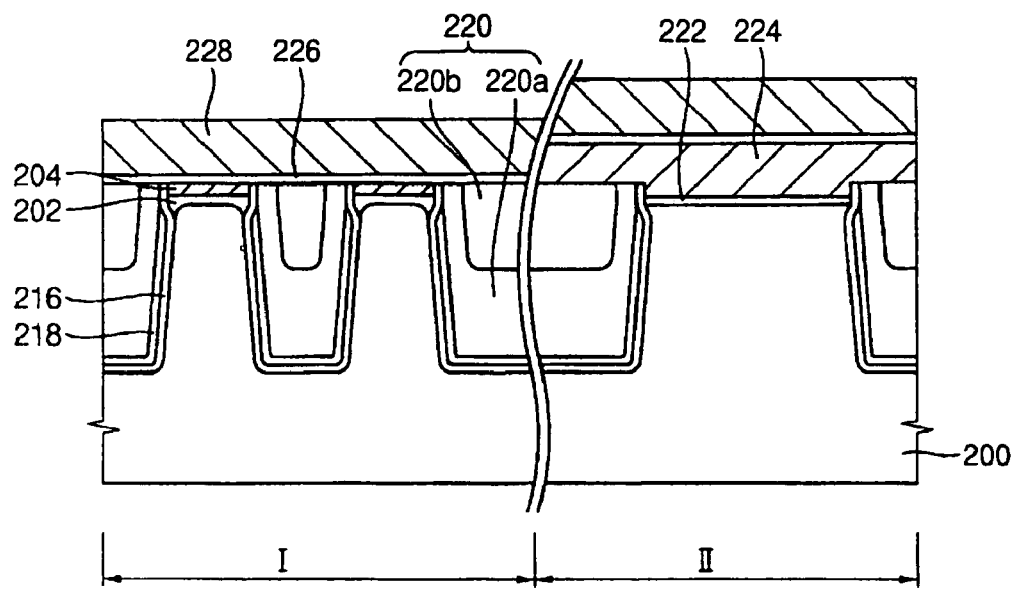

Referring to FIG. 12, a dielectric layer 226 may be formed on the nitride layer pattern 204. In example embodiments, the dielectric layer 226 may be formed using an oxide (e.g., silicon oxide). In example embodiments, the dielectric layer 226 may be formed using a relatively high dielectric material (e.g., a metal oxide). For example, the dielectric layer 226 may be formed using aluminum oxide, hafnium oxide, zirconium oxide, titanium oxide and/or tantalum oxide. An electrode 228 may be formed on the dielectric layer 226. The electrode 228 may be formed using doped polysilicon. Alternatively, the electrode 228 may have a multi-layered structure that may include a barrier metal film and a metal film.

After the polysilicon layer pattern 224 in the second area II is etched to form the gate electrode of the relatively low voltage MOS transistor, source/drain regions may be formed at portions of the second area II adjacent to the gate electrode, thereby forming the relatively low voltage MOS transistor in the second area II of the substrate 200.

According to example embodiments, an oxide layer may be formed in one area of a substrate without oxidation of a nitride layer positioned in another area of the substrate while ensuring sufficient charge trapping sites of the nitride layer. A nitride layer pattern serving as a charge trapping layer of a charge trapping type non-volatile memory device may be more easily formed without formation of an oxide layer between the nitride layer and a dielectric layer. The charge trapping type non-volatile memory device may have improved electrical characteristics due to the nitride layer pattern having sufficient charge trapping sites without oxidation thereof.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of forming a thin layer comprising:
    forming a nitride layer on a first area of a substrate; and
    forming an oxide layer on a second area of a substrate separate from the first area in order to reduce oxidation of the nitride layer by a radical oxidation process in which oxygen radicals react with the second area of the substrate and a blocking layer in the first area of the substrate.

2. The method of claim 1, further comprising forming the blocking layer on the nitride layer.

3. The method of claim 2, wherein forming the nitride layer includes forming silicon nitride and forming the oxide layer includes forming silicon oxide.

4. The method of claim 1, wherein the radical oxidation process is performed at a temperature of about 900° C. to about 1,200° C.

5. The method of claim 1, wherein the radical oxidation process is carried out using a source gas including hydrogen and oxygen under a pressure of about 0.001 Torr to about 1.0 Torr.

6. The method of claim 5, wherein a partial pressure of hydrogen in the source gas is about 10% to about 50% of a partial pressure of oxygen in the source gas.

7. The method of claim 1, wherein the oxygen radicals are generated using a plasma.

8. A method of manufacturing a semiconductor device, comprising:
    forming a structure including a tunnel oxide layer pattern, a charge trapping nitride layer pattern and a first blocking layer pattern on a substrate having a first area and a second area;
    forming a trench on a portion of the substrate adjacent to the structure;
    forming an isolation layer in the trench;
    partially removing the tunnel oxide layer pattern, the charge trapping nitride layer pattern and the first blocking layer pattern to expose the second area of the substrate;
    forming a thin layer by forming a nitride layer on a first area of a substrate, and forming an oxide layer on a second area of a substrate separate from the first area in order to reduce oxidation of the nitride layer by a radical oxidation process in which oxygen radicals react with the second area of the substrate and a blocking layer in the first area of the substrate, wherein the nitride layer is the charge trapping nitride layer pattern and the blocking layer is the first blocking layer pattern;
    removing the remaining first blocking layer pattern;
    forming a dielectric layer on the charge trapping nitride layer pattern; and
    forming an electrode on the dielectric layer.

9. The method of claim 8, wherein the charge trapping nitride layer pattern includes silicon nitride and the oxide layer includes silicon oxide.

10. The method of claim 8, wherein the first blocking layer pattern includes silicon oxide formed by a chemical vapor deposition process.

11. The method of claim 8, wherein forming the isolation layer includes:
    forming an insulation layer on the blocking layer pattern to fill the trench; and
    partially removing the insulation layer and the first blocking layer pattern.

12. The method of claim 11, wherein the remaining first blocking layer pattern has a thickness of about 50 Å to about 100 Å.

13. The method of claim 8, wherein forming the isolation layer includes:
    forming a first insulation film partially filling the trench; and
    forming a second insulation film fully filling the trench, the second insulation film having a crystalline structure denser than that of the first insulation film.

14. The method of claim 8, further comprising:
    forming a second blocking layer pattern on a sidewall of the structure; and
    oxidizing a portion of the substrate adjacent to the structure.

15. The method of claim 14, wherein oxidizing the portion of the substrate includes a radical oxidation process performed at a temperature of about 900° C. to about 1,200° C.

16. The method of claim 8, prior to forming the isolation layer, further comprising:
    forming a third blocking layer pattern on a sidewall of the trench and the structure; and
    forming a sidewall oxide layer on the sidewall of the trench by oxidizing the sidewall of the trench.

17. The method of claim 16, wherein forming the sidewall oxide layer includes forming the sidewall oxide layer at a temperature of about 900° C. to about 1,200° C.

18. The method of claim 8, wherein the oxide layer in the second area of the substrate has a thickness of about 30 Å to about 100 Å.

* * * * *